(12) United States Patent
Uemura et al.

(10) Patent No.: US 10,896,872 B2
(45) Date of Patent: Jan. 19, 2021

(54) CONNECTING STRUCTURE AND CIRCUIT (71) Applicant: NEC Corporation, Tokyo (JP)

(72) Inventors: Ayako Uemura, Tokyo (JP); Kazuhiro Kashiwakura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 69 days.

(21) Appl. No.: 16/335,019

(22) PCT Filed: Sep. 15, 2017

(86) PCT No.: PCT/JP2017/033425
§ 371 (c)(1),
(2) Date: Mar. 20, 2019

(87) PCT Pub. No.: WO2018/056200
PCT Pub. Date: Mar. 29, 2018

(65) Prior Publication Data
US 2019/0252310 A1  Aug. 15, 2019

(30) Foreign Application Priority Data

Sep. 21, 2016 (JP) ................................. 2016-183934

(51) Int. Cl.
*H01L 23/522* (2006.01)
*H05K 3/46* (2006.01)
*H05K 3/00* (2006.01)

(52) U.S. Cl.
CPC ...... *H01L 23/5223* (2013.01); *H01L 23/5226* (2013.01); *H05K 3/00* (2013.01); *H05K 3/46* (2013.01)

(58) Field of Classification Search
CPC ......................... H01L 23/5223; H01L 23/5226
See application file for complete search history.

(56) References Cited

U.S. PATENT DOCUMENTS 6,137,064 A   10/2000  Kiani et al.
6,388,208 B1   5/2002  Kiani et al.
(Continued)

FOREIGN PATENT DOCUMENTS

JP    H09-8456 A      1/1997
JP    2004-235629 A   8/2004
(Continued)

OTHER PUBLICATIONS

International Search Report for PCT Application No. PCT/JP2017/033425, dated Dec. 5, 2017.
(Continued)

*Primary Examiner* — Mark V Prenty (57) ABSTRACT

The present invention addresses the problem of providing a connecting structure or similar that can minimize a decrease in a wireable region of a substrate while reducing the effect of stubs of a pair of vias on the output of a capacitor that is connected to said vias. In order to solve this problem, this connecting structure comprises: a first conductor that passes through a substrate and is provided with a first input/output section; a second conductor that passes through the substrate and is provided with a second input/output section; a first capacitor, one terminal of which being connected to a terminal of the first conductor that is on a first surface of the substrate, the other terminal of which being connected to a terminal of the second conductor that is on the first surface of the substrate; and a second capacitor or a resistor.

14 Claims, 11 Drawing Sheets

(56) References Cited

U.S. PATENT DOCUMENTS

| | | |
|---|---|---|
| 2004/0150969 A1 | 8/2004 | Chan et al. |
| 2007/0130555 A1 | 6/2007 | Osaka |
| 2007/0217173 A1 | 9/2007 | Mizutani et al. |
| 2008/0093702 A1 | 4/2008 | Cheng et al. |
| 2013/0009322 A1 | 1/2013 | Conn et al. |
| 2014/0063765 A1 | 3/2014 | Kashiwakura |
| 2015/0351240 A1 | 12/2015 | Nabeyama |
| 2019/0252310 A1* | 8/2019 | Uemura ............. H01L 23/5226 |

FOREIGN PATENT DOCUMENTS

| | | |
|---|---|---|
| JP | 2007-142307 A | 6/2007 |
| JP | 2007-250818 A | 9/2007 |
| JP | 2007-317716 A | 12/2007 |
| JP | 2009-135679 A | 6/2009 |
| JP | 2011-014759 A | 1/2011 |
| JP | 2014-229865 A | 12/2014 |
| JP | 2015-225960 A | 12/2015 |
| JP | 2016-018837 A | 2/2016 |
| WO | 2012/133755 A1 | 10/2012 |

OTHER PUBLICATIONS

English translation of Written opinion for PCT Application No. PCT/JP2017/033425.
Japanese Office Action for JP Application No. 2018-541036 dated Jan. 14, 2020 with English Translation.

* cited by examiner

CONNECTING STRUCTURE AND CIRCUIT

This application is a National Stage Entry of PCT/JP2017/033425 filed on Sep. 15, 2017, which claims priority from Japanese Patent Application 2016-183934 filed on Sep. 21, 2016, the contents of all of which are incorporated herein by reference, in their entirety.

TECHNICAL FIELD

The present invention relates to a connecting structure between a plurality of through-hole vias.

BACKGROUND ART

In order to make an output section of a certain circuit and an input section of another circuit be in an AC coupling state, a capacitor is generally inserted between the output section and the input section. Here, AC is an abbreviation of alternating current.

When such capacitor is mounted between a pair of through-hole vias (hereinafter, referred to as "via") installed in a substrate, the capacitor is connected between terminals of the pair of vias exposed on one surface of the substrate. Then, wirings incorporated in the substrate are connected to a part of side portions of the vias electrically. Therefore, a stub which is a portion through which electric current does not flow will exist in the vias (refer to Patent Literature 1 and 2).

On the other hand, it has been explained that existence of a stub causes a predetermined output signal deterioration (refer to Patent Literature 1 and 2).

In order to suppress influence of such stub on an output signal deterioration, it is known that substrate processing by a back drill to eliminate a stub is effective (refer to Patent Literature 1 and 3).

Also, in Patent Literature 4, there is disclosed a device in which a land pattern that has a capacitive or inductive load by being coupled to a pair of conductor elements is arranged in a position corresponding to any one or both of the pair of conductor elements on the back face of a dipole antenna.

Patent Literature 5 has a description about the above-mentioned via.

CITATION LIST

Patent Literature

[PTL 1] WO 2012/133755
[PTL 2] Japanese Patent Application Laid-Open No. 2007-142307
[PTL 3] Japanese Patent Application Laid-Open No. 2004-235629
[PTL 4] Japanese Patent Application Laid-Open No. 2009-135679
[PTL 5] Japanese Patent Application Laid-Open No. 1997-8456

SUMMARY OF INVENTION

Technical Problem

In the substrate processing by a back drill mentioned above, there is an issue that a wireable region in a substrate is decreased because it is processing that eliminates not only the stub but also a part of the substrate around the stub.

An object of the present invention is to provide a connecting structure and the like which can reduce influence of stubs of a pair of vias on the output of a capacitor connected to the vias while suppressing decrease in a wireable region in a substrate.

Solution to Problem

A connecting structure of the present invention includes: a first conductor that passes through a substrate and is provided with a first input/output section; a second conductor that passes through the substrate and is provided with a second input/output section; a first capacitor, one terminal of which being connected to a terminal of the first conductor that is on a first surface of the substrate, the other terminal of which being connected to a terminal of the second conductor that is on the first surface of the substrate; and a second capacitor or resistor, one terminal of which being connected to a terminal of the first conductor that is on a second surface of the substrate, another terminal of which that is not connected to the one terminal being connected to a terminal of the second conductor that is on the second surface, wherein the first input/output section is provided in a portion of a side section of the first conductor, and/or the second input/output section is provided in a portion of a side section of the second conductor.

Advantageous Effects of Invention

A connecting structure and the like of the present invention can reduce influence of stubs of a pair of vias on the output of a capacitor connected to the vias while suppressing decrease in a wireable region in a substrate.

EXAMPLE EMBODIMENT

Investigation Into Influence of a Stub

First, influence of stubs of a pair of via holes provided with a capacitor on output has been checked.

Figure 1:
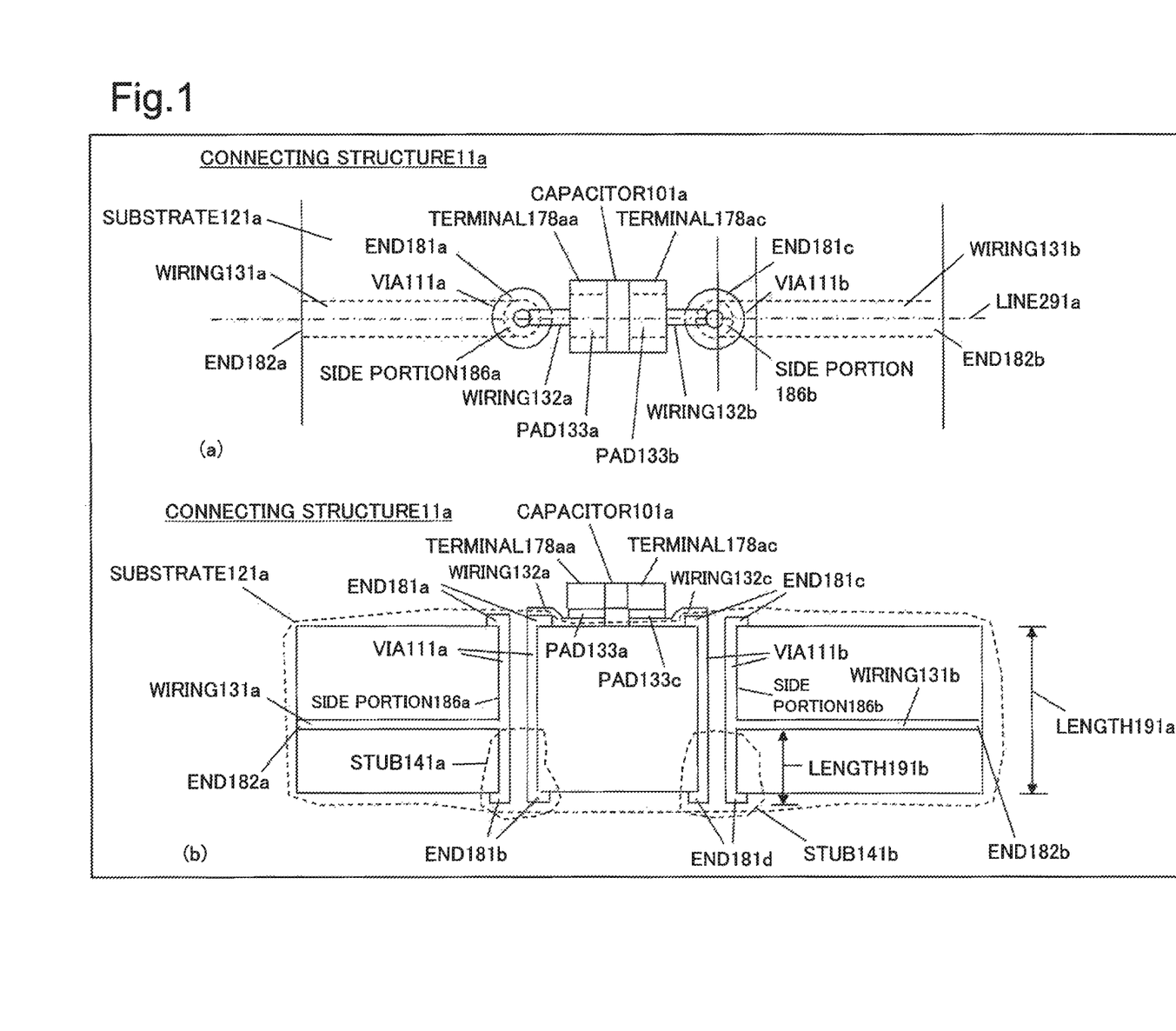
FIG. 1 is a conceptual diagram illustrating a configuration of a connecting structure used for the present investigation.

FIG. 1 is a conceptual diagram illustrating a configuration of a connecting structure 11a used for the present investigation. FIG. 1 (a) is a top view of the connecting structure 11a. FIG. 1 (b) is a sectional view on the assumption that the connecting structure 11a is cut by a line 291a indicated in FIG. 1 (a).

The connecting structure 11a includes a substrate 121a, a capacitor 101a, wirings 132a and 132c and pads 133a and 133c.

The substrate 121a includes wirings 131a and 131b and vias 111a and 111b. The thickness of the substrate 121a is a length 191a.

The vias 111a and 111b are installed in the substrate 121a in a manner penetrating the substrate 121a. Description of details of the vias 111a and 111b will be made later with reference to FIG. 2.

The wirings 131a and 131b are general wirings formed inside the substrate 121a. Since structures, materials, and manufacturing methods of general wirings to be formed inside a substrate are well-known, description of those will be omitted.

Although being connected to a part of a side portion 186a of the via 111a, the wiring 131a is not connected to the via 111b.

Although being connected to a part of a side portion 186b of the via 111b, the wiring 131b is not connected to the via 111a.

A terminal 178aa of the capacitor 101a is connected to an end 181a of the via 111a through a wiring 132a and a pad 133a. A terminal 178ac of the capacitor 101a is connected to an end 181c of the via 111b through a wiring 132c and a pad 133c.

In addition, an element or the like is not connected to an end 181b of the via 111a and an end 181d of the via 111b.

A portion in the via 111a from the neighborhood of a part connected to the wiring 131a to the end 181b is a stub 141a. A portion in the via 111b from the neighborhood of a part connected to the wiring 131b to the end 181d is a stub 141b.

Then, the length from the lower part of the wiring 131a to the lower part of the end 181b will be called a stub length of the stub 141a. Similarly, the length from the lower part of the wiring 131b to the lower part of the end 181d will be called a stub length of the stub 141b. In the connecting structure 11a, both the stub length of the stub 141a and the stub length of the stub 141b are a length 191b.

The capacitor 101a makes predetermined alternating current components of a signal inputted to one terminal of the capacitor 101a be outputted to the other terminal of the capacitor 101a, but does not allow the DC component of the signal to be outputted to the other terminal. The capacitor 101a is an AC coupling capacitor, for example. Here, AC is an abbreviation of alternating current.

Figure 2:
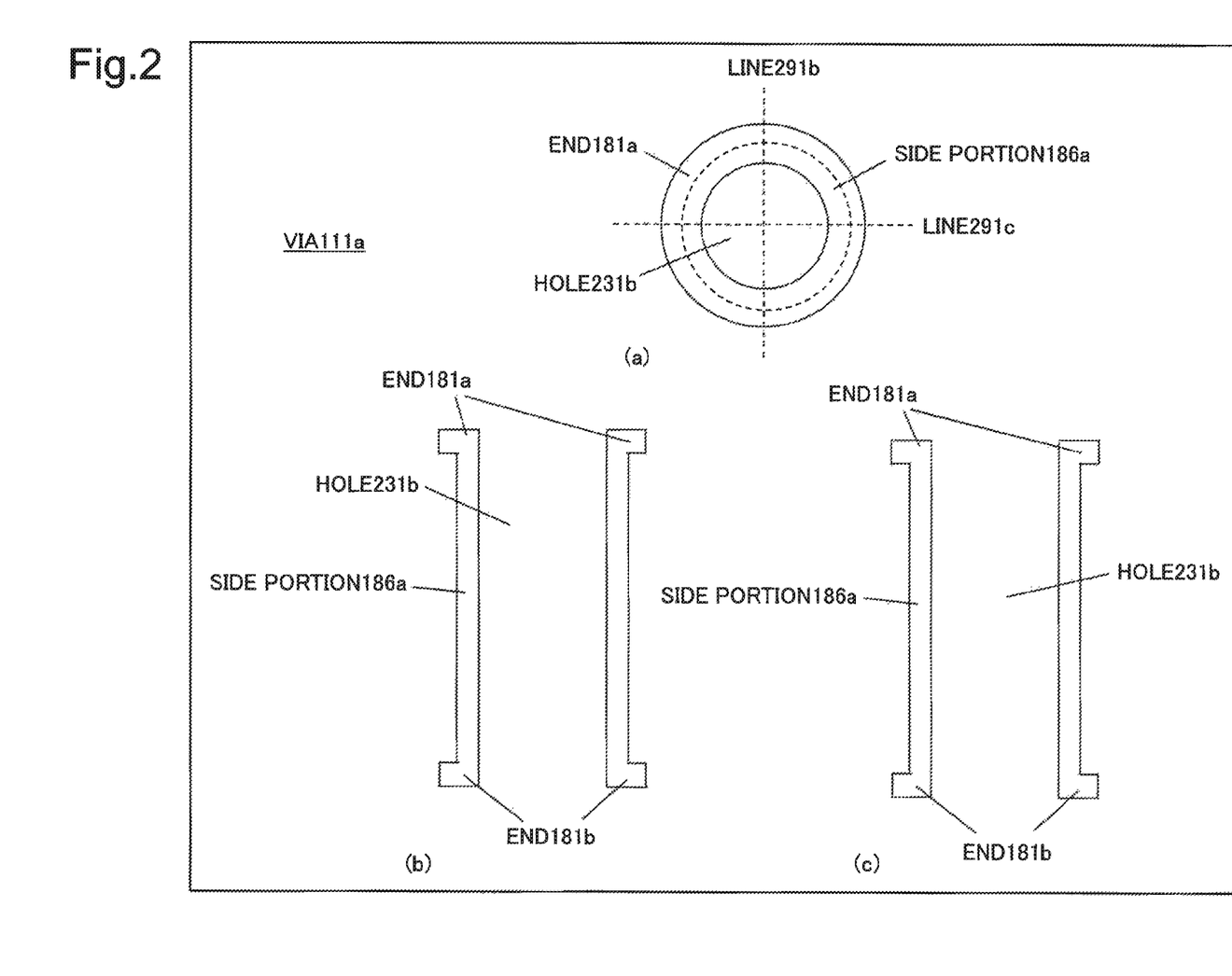
FIG. 2 is a conceptual diagram illustrating a via.

FIG. 2 is a conceptual diagram illustrating the via 111a indicated in FIG. 1. FIG. 2 (a) is a top view. FIG. 2 (b) is a sectional view assuming a case of cutting by a line 291b indicated in FIG. 2 (a). FIG. 2 (c) is a sectional view assuming a case of cutting by a line 291c indicated in FIG. 2 (a).

The via 111a includes the side portion 186a, the end 181a and the end 181b. The side portion 186a is a part which is connected electrically to the wiring 131a indicated in FIG. 1. Into the via 111a, there is formed a hole 231b.

The via 111a can be installed in the substrate 121a indicated in FIG. 1 by a method disclosed in patent literature 5, for example.

It should be noted that the via 111b indicated in FIG. 1 also has a similar structure as that of the via 111a indicated in FIG. 2.

Next, a measurement result of an insertion loss in each case when changing a stub length in the connecting structure 11a indicated in FIG. 1 will be described. The insertion loss indicates a loss of electric power that propagates to the wiring 131b in a dB unit when an input signal is inputted to the wiring 131a. The insertion loss is a numerical value to be an index representing a decline in an output signal relative to an input signal. That the insertion loss is large in the negative direction means that a decline in an output signal relative to an input signal is large.

In the connecting structure 11a used for the present measurement, the capacitance of the capacitor 101a is fixed to 0.1 μF and the thickness of the substrate (the length 191a of FIG. 1) is fixed to 2.65 mm.

Figure 3:
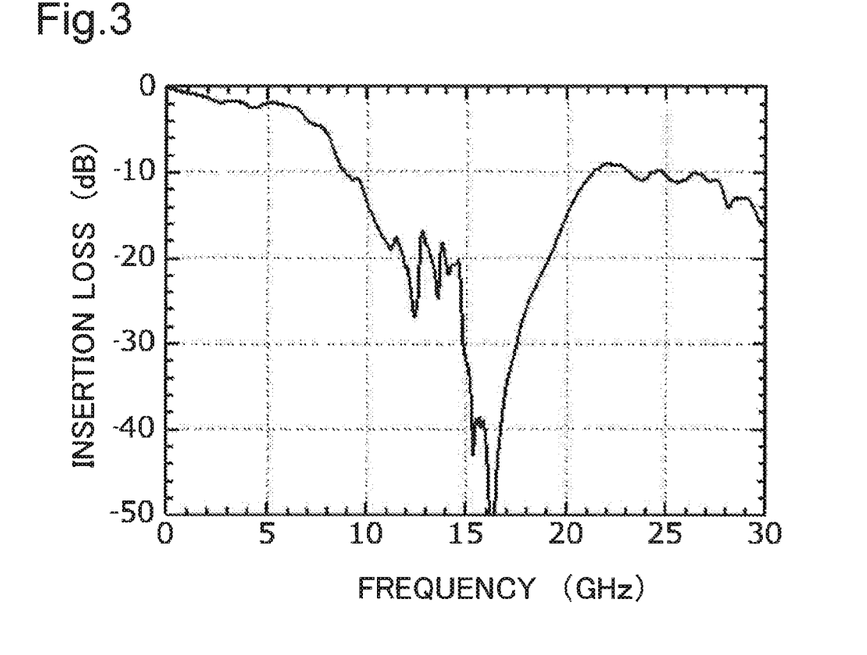
FIG. 3 is a diagram illustrating a frequency dependence of an insertion loss when making a stub length be 1.6 mm.

FIG. 3 is a diagram illustrating a frequency dependence of the insertion loss when making the stub length (the length 191b indicated in FIG. 1) be 1.6 mm.

The aforementioned insertion loss increases greatly in the negative direction between the frequencies of 9 GHz and 21 GHz.

Figure 4:
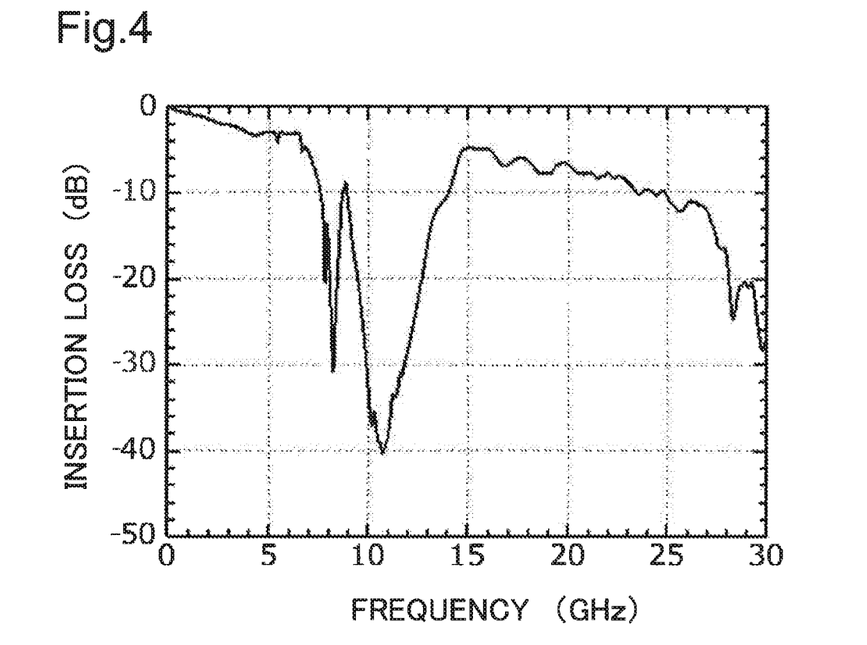
FIG. 4 is a diagram illustrating a frequency dependence of an insertion loss when making a stub length be 1.2 mm.

FIG. 4 is a diagram illustrating a frequency dependence of the insertion loss when making the stub length (the length 191b indicated in FIG. 1) be 1.2 mm.

Although the magnitudes of the insertion loss were 10 dB or less for the frequencies of 6 GHz or less and was from 15 GHz to 25 GHz, the insertion loss increased greatly in the negative direction between the frequency of 6 GHz and 15 GHz. When compared with FIG. 3, the degree of the increase of the insertion loss in the negative direction is slightly small.

Figure 5:
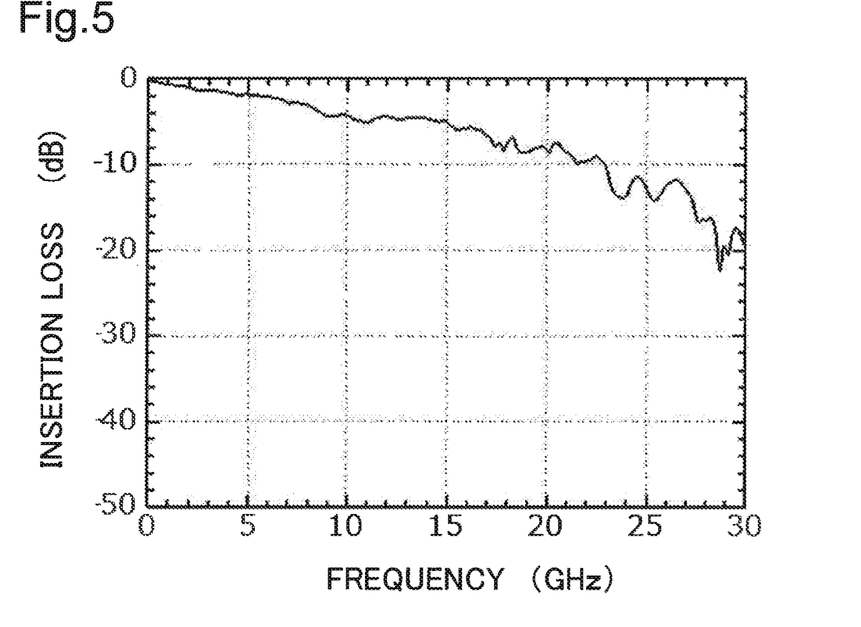
FIG. 5 is a diagram illustrating a frequency dependence of an insertion loss when making a stub length be 0.2 mm.

FIG. 5 is a diagram illustrating a frequency dependence of the insertion loss when making the stub length (the length 191b indicated in FIG. 1) be 0.2 mm.

The degree of the increase of the insertion loss in the negative direction is remarkably small compared with those of FIG. 3 and FIG. 4.

Figure 6:
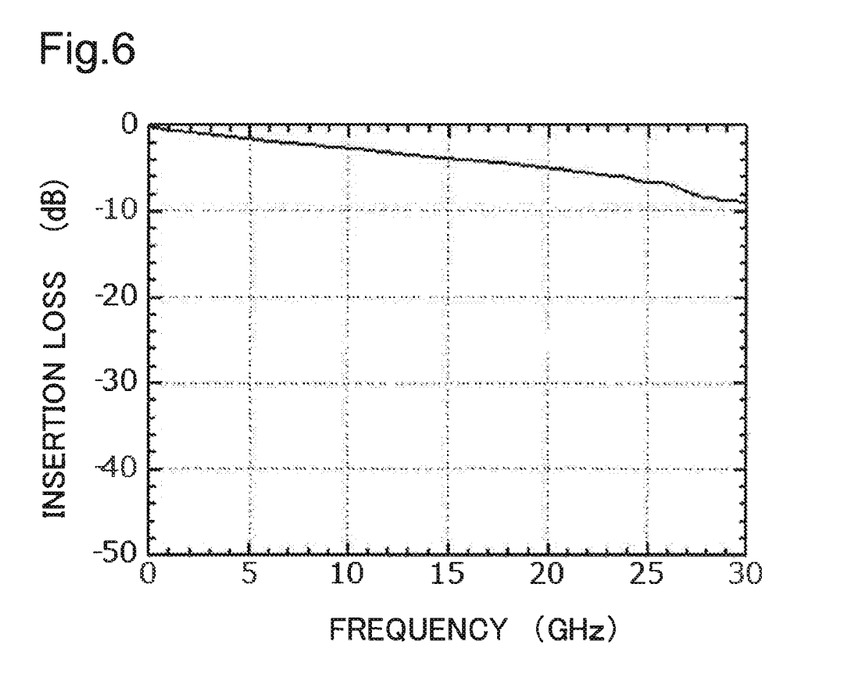
FIG. 6 is a diagram illustrating a frequency dependence of an insertion loss when making a stub length be 0.

FIG. 6 is a diagram illustrating a frequency dependence of the insertion loss when making the stub length (the length 191b indicated in FIG. 1) be 0. That the stub length is 0 means that the wirings 131a and 131b indicated in FIG. 1 are exposed on the under surface of the substrate 121a and the stubs 141a and 141b do not exist.

The degree of the increase in the insertion loss in the negative direction is remarkably small compared with those of FIG. 3 and FIG. 4.

According to FIGS. 3 to 6 mentioned above, there was a tendency that the longer a stub length was, the larger a degree of increase of such insertion loss in the negative direction was. It is disclosed in Patent Literature 1 and 2 that reflection of an input signal and an output signal at a stub influences on a decline in an output of a predetermined signal due to existence of the stub.

In the connecting structure 11a indicated in FIG. 1, it was inferred that reflection of an input signal at the end 181b and reflection of an output signal at the end 181*d* had influenced on the insertion loss indicated in FIGS. 3 to 5. If that is the case, it was concluded that it would be effective to adopt a structure that can suppress reflection of a signal caused at the end 181*b* and the end 181*d* to reduce the degree of increase in the insertion loss in the negative direction. As such structure that can suppress reflection of such signal, a structure in which a capacitor or a resistance is inserted between the end 181*b* and the end 181*d* is conceivable, for example.

Hereinafter, example embodiments concerning structures in which a capacitor or a resistance is inserted between the end 181*b* and the end 181*d* will be described.

The First Example Embodiment

The first example embodiment is an example embodiment about a connecting structure in which, to the ends of a pair of vias not connected to a capacitor, another capacitor is connected.

Configuration

Figure 7:
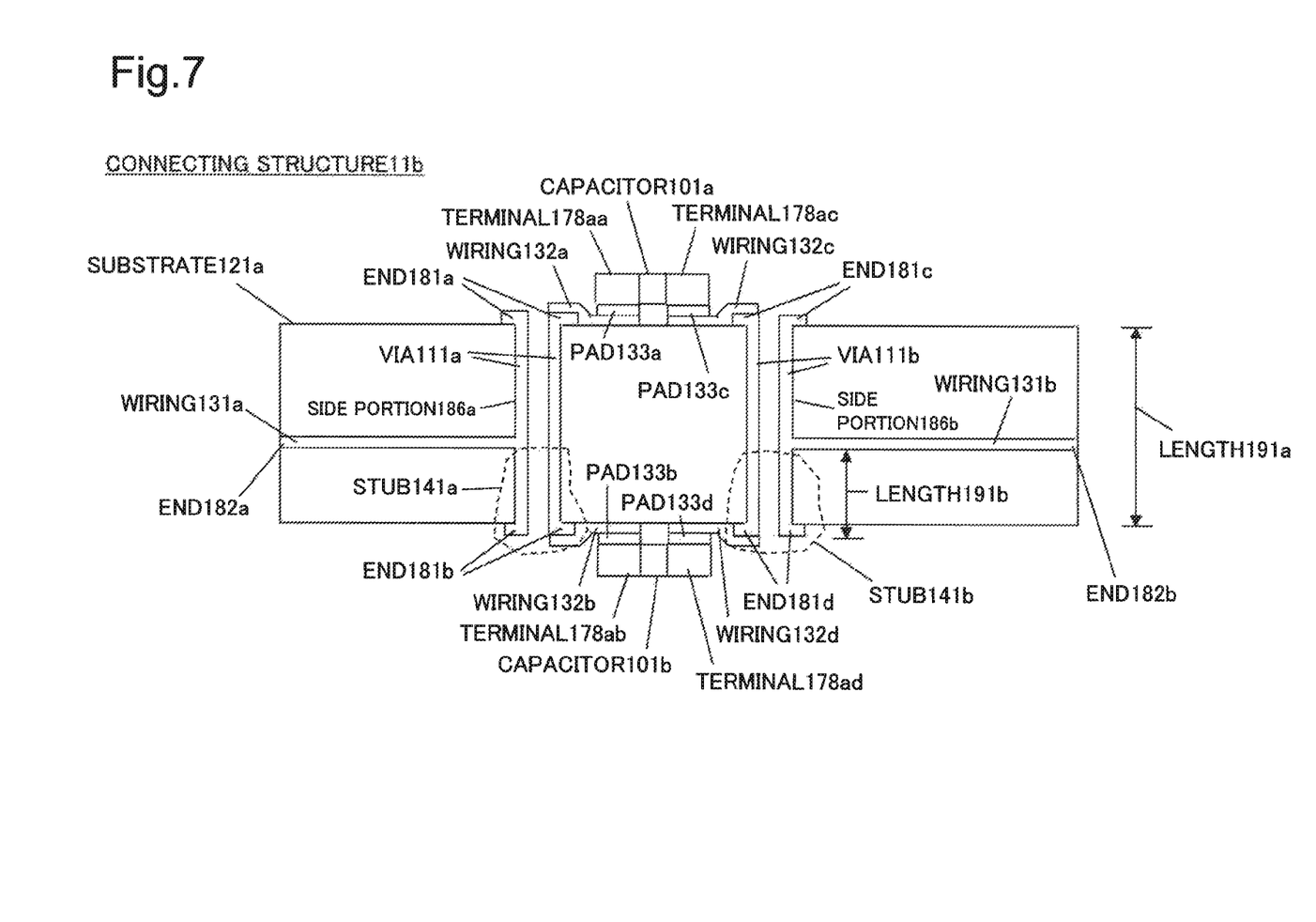
FIG. 7 is a sectional conceptual diagram illustrating an exemplary configuration of a connecting structure of a first example embodiment.

FIG. 7 is a sectional conceptual diagram illustrating a configuration of a connecting structure 11*b* which is an example of a connecting structure of the first example embodiment.

The connecting structure 11*b* includes, in addition to the configuration of the connecting structure 11*a* indicated in FIG. 1, a capacitor 101*b*, wirings 132*b* and 132*d*, and pads 133*b* and 133*d*.

Description about each configuration indicated in FIG. 7 is similar to the description about each configuration indicated in FIG. 1 except for the following description. In this regard, however, when there is contradiction between the following description and the description of each configuration indicated in FIG. 1, the following description is given priority.

A terminal 178*ab* of the capacitor 101*b* is connected to the end 181*b* of the via 111*a* with the wiring 132*b* and the pad 133*b* therebetween. A terminal 178*ad* of a capacitor 101*d* is connected to the end 181*d* of the via 111*b* with the wiring 132*d* and the pad 133*d* therebetween.

Next, a measurement result about an insertion loss in the configuration indicated in FIG. 7 will be described. Such insertion loss indicates a loss of electric power that propagates to the wiring 131*b* in a dB unit when an input signal is inputted to the wiring 131*a*. The insertion loss is a numerical value to be an index representing a decline in an output signal relative to an input signal. That such insertion loss is large in the negative direction means that a decline in an output signal relative to an input signal is large.

In the connecting structure 11*a* used for the present measurement, the stub length is fixed to 1.2 mm and the thickness (the length 191*a* of FIG. 1) of the substrate is fixed to 2.65 mm, and the capacitances of the capacitors 101*a* and 101*b* are changed.

Figure 8:
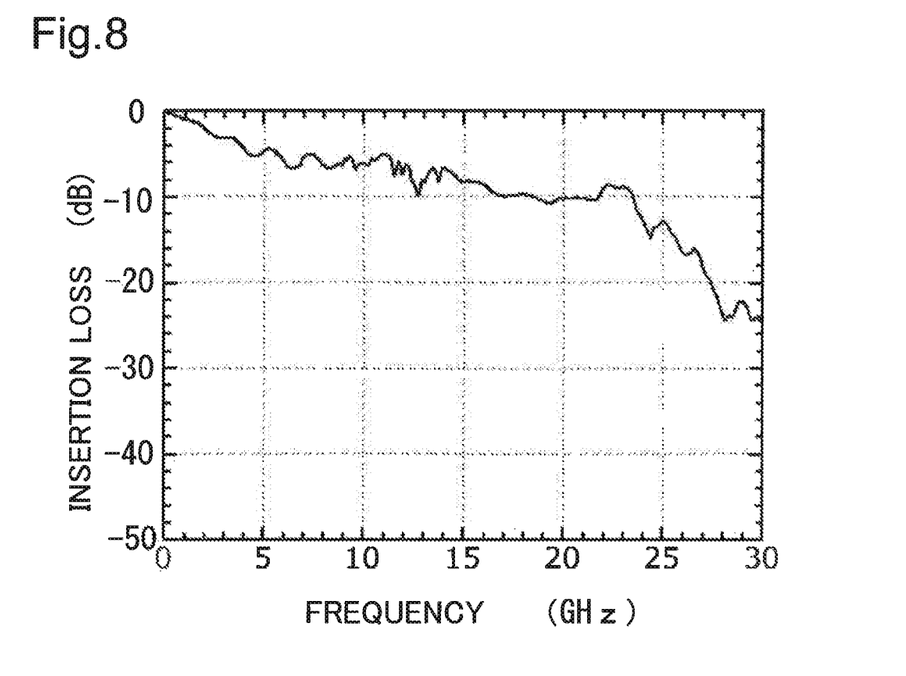
FIG. 8 is a diagram illustrating a frequency dependence of an insertion loss for the capacitance of capacitors of 0.1 µF together.

FIG. 8 is a diagram illustrating a frequency dependence of the insertion loss for the capacitances of the capacitors 101*a* and 101*b* of 0.1 µF together.

In the frequency dependence of the insertion loss indicated in FIG. 8, a large increase of the output in the negative direction in the frequency range from 6 GHz to 15 GHz that was seen in the frequency dependence of the insertion loss indicated in FIG. 4 is not observed. In the frequency dependence of the insertion loss indicated in FIG. 8, the magnitudes of the insertion loss is about 10 dB or less in the frequency of 23 GHz or less, and thus the frequency characteristics of the insertion loss was improved.

Figure 9:
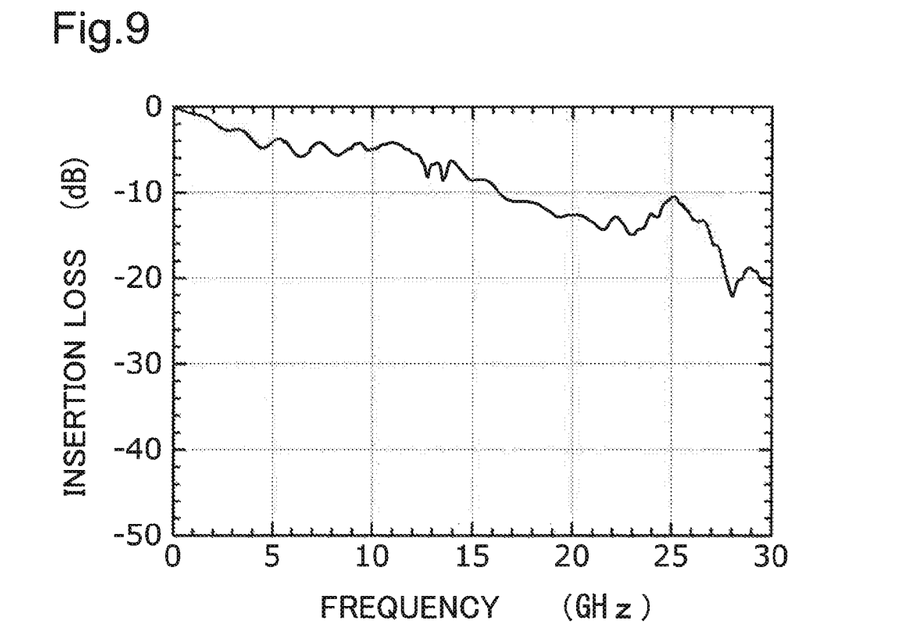
FIG. 9 is a diagram illustrating a frequency dependence of an insertion loss for the capacitance of capacitors to 1 µF together.

FIG. 9 is a diagram illustrating the frequency dependence of the insertion loss for the capacitances of the capacitors 101*a* and 101*b* of 1 µF together.

The frequency dependence of the insertion loss indicated in FIG. 9 is almost similar to that of the output indicated in FIG. 8.

Figure 10:
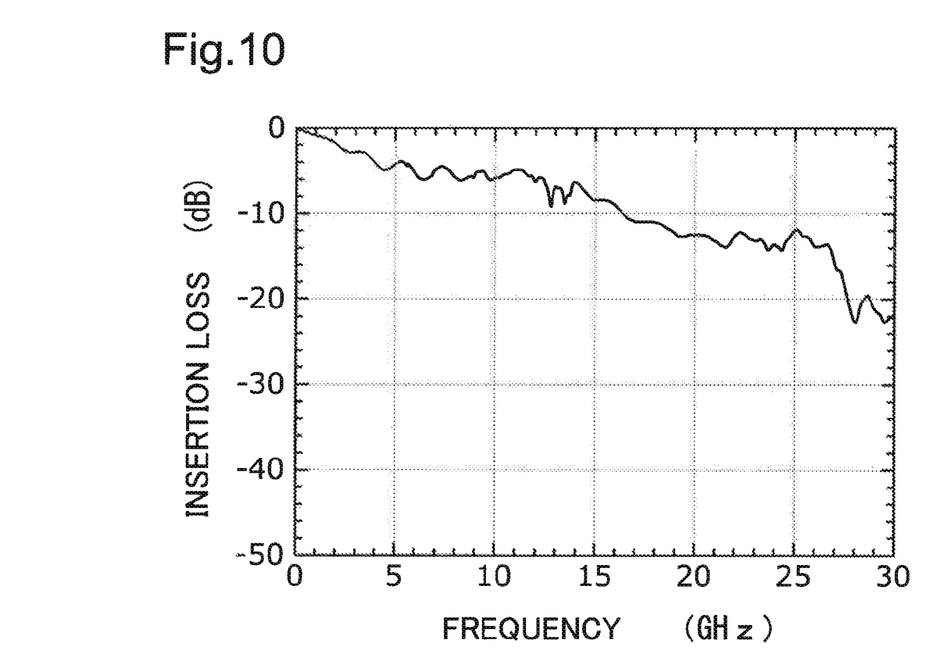
FIG. 10 is a diagram illustrating a frequency dependence of an insertion loss for the capacitance of capacitors of 0.01 µF together.

FIG. 10 is a diagram illustrating a frequency dependence of the insertion loss for the capacitances of the capacitors 101*a* and 101*b* of 0.01 µF together.

The frequency dependence of the insertion loss indicated in FIG. 10 is almost similar to that of the insertion loss indicated in FIG. 8.

As the measurement results of the frequency characteristics of the insertion loss indicated in FIGS. 8 to 10 represent, with the capacitor 101*b* between the end 181*b* and the end 181*d*, the connecting structure 11*b* can obtain good frequency characteristics of the insertion loss. The above improvement is a matter that was understood by installing the capacitor 101*b* of various capacitances and measuring the frequency characteristics of the insertion loss actually.

The connecting structure 11*b* obtains the good frequency characteristics of the insertion loss only with the capacitor 101*b* between the end 181*b* and the end 181*d* without executing deletion of the stub 141*a* and 141*b* by a drill or the like and without using a special structure.

Figure 11:
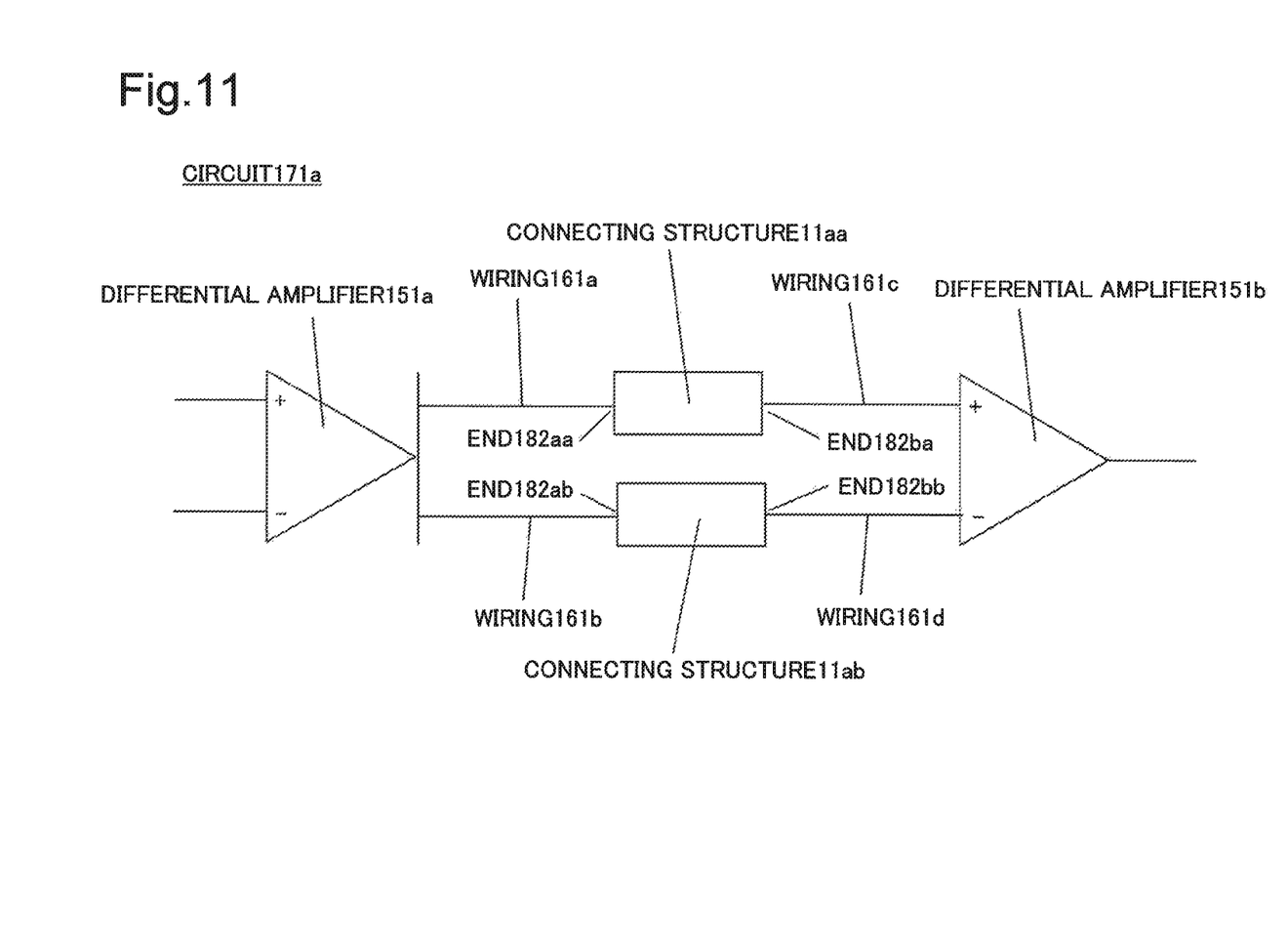
FIG. 11 is a circuit diagram illustrating an example of a circuit to which a connecting structure of the first example embodiment has been applied.

FIG. 11 is a circuit diagram illustrating a circuit 171*a* that is an example of a circuit to which the connecting structure 11*b* indicated in FIG. 7 is applied.

The circuit 171*a* includes differential amplifiers 151*a* and 151*b*, connecting structures 11*aa* and 11*ab*, and wirings 161*a* to 161*d*. Here, each of the connecting structures 11*aa* and 11*ab* is the connecting structure 11*b* indicated in FIG. 7. Ends 182*aa* and 182*ba* indicated in FIG. 11 are the ends 182*a* and 182*b* indicated in FIG. 7 in the connecting structure 11*aa*. Ends 182*ab* and 182*bb* indicated in FIG. 11 are the ends 182*a* and 182*b* indicated in FIG. 7 in the connecting structure 11*ab*.

One output terminal of the differential amplifier 151*a* is connected to the end 182*aa* of the connecting structure 11*aa* through the wiring 161*a*. The other output terminal of the differential amplifier 151*a* is connected to the end 182*ab* of the connecting structure 11*ab* through the wiring 161*b*.

The End 182*ba* of the connecting structure 11*aa* is connected to the positive input terminal of the differential amplifier 151*b* through the wiring 161*c*. The end 182*bb* of the connecting structure 11*ab* is connected to the negative input terminal of the differential amplifier 151*b* through the wiring 161*d*.

For example, the circuit 171*a* is used as a differential circuit between the input/output buffers.

In a differential circuit between input/output buffers, it is understood by experience that an input signal to one differential amplifier is requested to have better frequency characteristics of an insertion loss while eliminating a DC component from an output signal of the one differential amplifier. Here, the above mentioned one differential amplifier is a differential amplifier corresponding to the differential amplifier 151*b* indicated in FIG. 11. Also, the aforementioned other differential amplifier is a differential amplifier corresponding to the differential amplifier 151*a* corresponding to FIG. 11. The frequency characteristics of the insertion loss of the connecting structure 11*b* indicated in FIG. 7 is better as described above. Therefore, the circuit 171*a* is suitable for being used as a differential circuit between input/output buffers.

Advantageous Effect

The connecting structure of this example embodiment can obtain good frequency characteristics of insertion loss by installing a capacitor between ends of two stubs. Such improvement is a matter that was understood by measuring a frequency dependence of the insertion loss about connecting structures into which a capacitor of various capacitances are installed actually between the terminals.

In the connecting structure of this example embodiment, the good frequency characteristics of insertion loss is obtained only by just installing a capacitor without performing deletion of a stub by a drill or the like and without using a special structure.

In the above first example embodiment, with the assumption that there exists the influence of reflection of an input signal and an output signal at ends of stubs due to existence of the stubs on the output, a capacitor was installed between terminals of two stubs for the purpose of suppressing the reflection. By this, it was actually confirmed that it was possible to suppress increase of the insertion loss in the negative direction.

If so, it was presumed that a component to connect between terminals of two stubs did not need to be a capacitor necessarily if such reflection could be suppressed, and that there was a possibility that the component might be a resistance, for example.

Next, an output improvement effect when connecting a resistance between terminals of two stubs will be described.

The Second Example Embodiment

The second example embodiment is an example embodiment about a connecting structure in which a resistance is connected between terminals of two stubs.

Configuration

Figure 12:
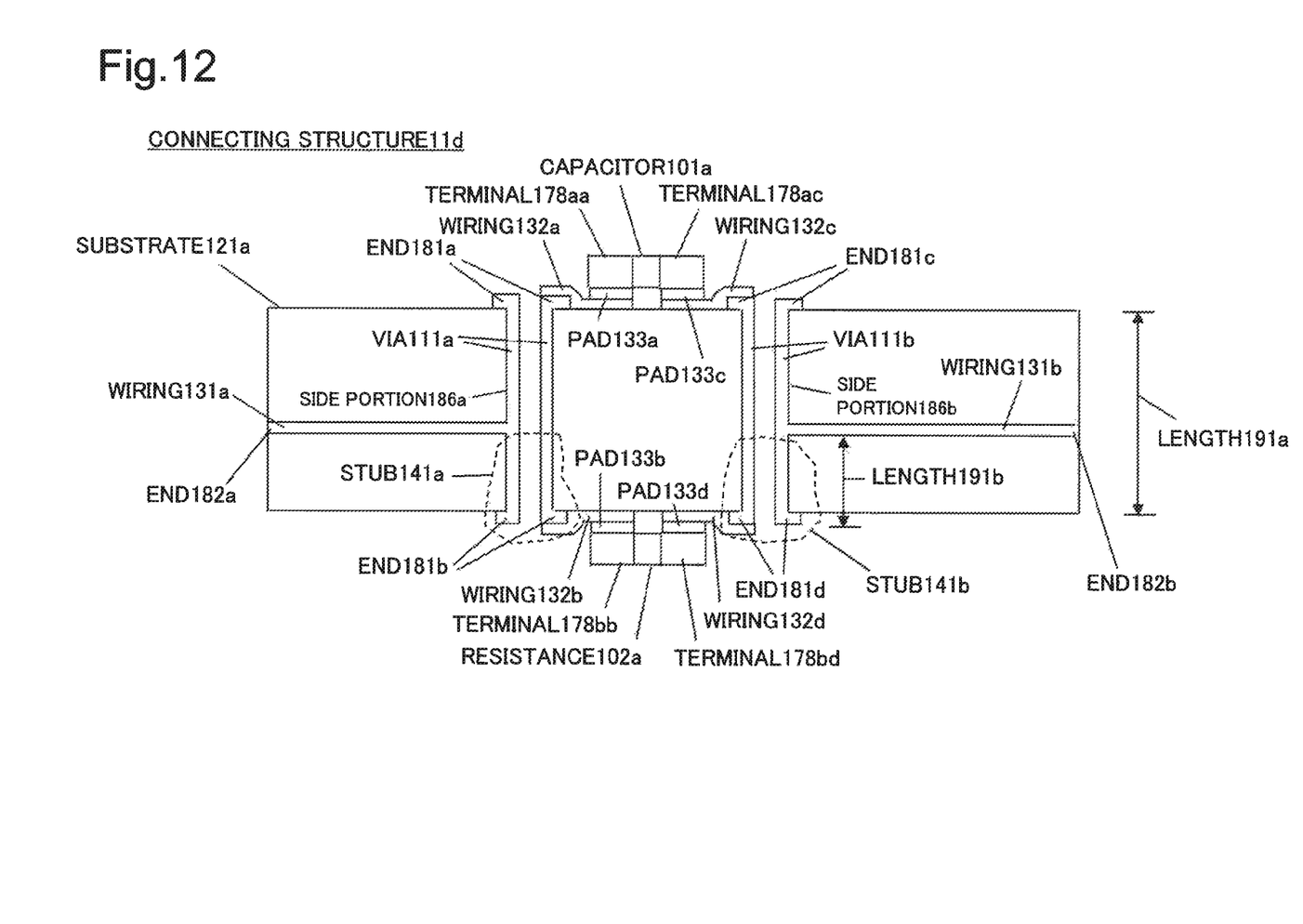
FIG. 12 is a sectional conceptual diagram illustrating an exemplary configuration of a connecting structure of a second example embodiment.

FIG. 12 is a sectional conceptual diagram illustrating the configuration of a connecting structure 11$d$ which is an example of a connecting structure according to the second example embodiment.

The connecting structure 11$d$ has a resistance 102$a$ in addition to the configuration of the connecting structure 11$a$ indicated in FIG. 1.

Description about each configuration indicated in FIG. 12 is identical with the description about each configuration indicated in FIG. 1 except for the following description. However, when the following description and the description about each configuration indicated in FIG. 1 is in contradiction with each other, the following description is given priority.

A terminal 178$bb$ of the resistance 102$a$ is connected to the end 181$b$ of the via 111$a$ through the wiring 132$b$ and the pad 133$b$. A terminal 178$bd$ of the resistance 102$a$ is connected to the end 181$d$ of the via 111$b$ through the wiring 132$d$ and the pad 133$d$.

Next, a measurement result about an insertion loss in the structure indicated in FIG. 12 will be described. Such insertion loss is a loss of an electric power to be propagated to the wiring 131$b$ expressed in units of dB when an input signal is inputted to the wiring 131$a$. The insertion loss is a numerical value to be an index representing a decline in an output signal relative to an input signal. That the insertion loss is large in the negative direction means that a decline in an output signal relative to an input signal is large.

In the connecting structure 11$d$ used for the measurement, the stub length is 1.2 mm, the thickness of the substrate (the length 191$a$ in FIG. 1) is 2.65 mm, the capacitance of the capacitor 101$a$ is 0.1 μF, and the resistance value of the resistance 102$a$ is 10Ω.

Figure 13:
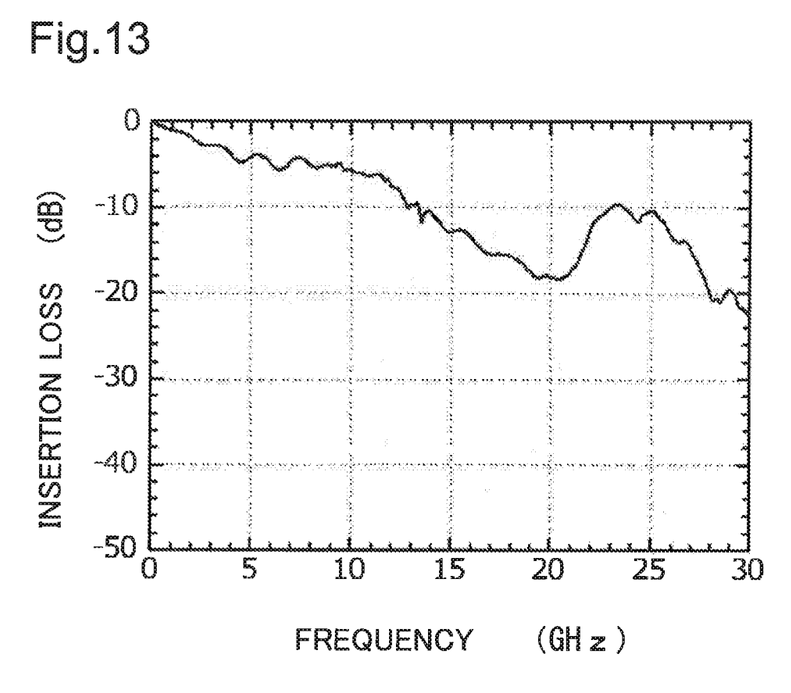
FIG. 13 is a diagram illustrating a frequency dependence of an insertion loss in a connecting structure of the second example embodiment.

FIG. 13 is a diagram illustrating a frequency dependence of the insertion loss in the connecting structure 11$d$.

In the frequency dependence of the insertion loss represented in FIG. 13, there is no large increase of an insertion loss in the negative direction in the frequency range from 6 GHz to 15 GHz which was appeared in the frequency dependence of the insertion loss indicated in FIG. 4, and thus the frequency characteristics of the insertion loss is improved compared with the case indicated in FIG. 4.

As above, it was understood that an improvement effect of the frequency characteristics of the insertion loss was able to be obtained even if a component inserted between the ends 181$b$ and 181$d$ was a resistance, not a capacitor.

The connecting structure 11$d$ represented in FIG. 12 can be employed as each of the connecting structures 11$aa$ and 11$ab$ represented in FIG. 11.

Advantageous Effect

By installing a resistance between ends of two stubs, the connecting structure of this example embodiment can obtain good frequency characteristics of insertion loss. Such improvement is a matter that was confirmed by measuring a frequency dependence of the insertion loss about a connecting structure in which a resistance was installed actually between the terminals concerned.

In the connecting structure of this example embodiment, without elimination of a stub by a drill or the like and without using a special structure, such improvement of the frequency characteristics of the insertion loss can be realized only by just installing a resistance.

Figure 14:
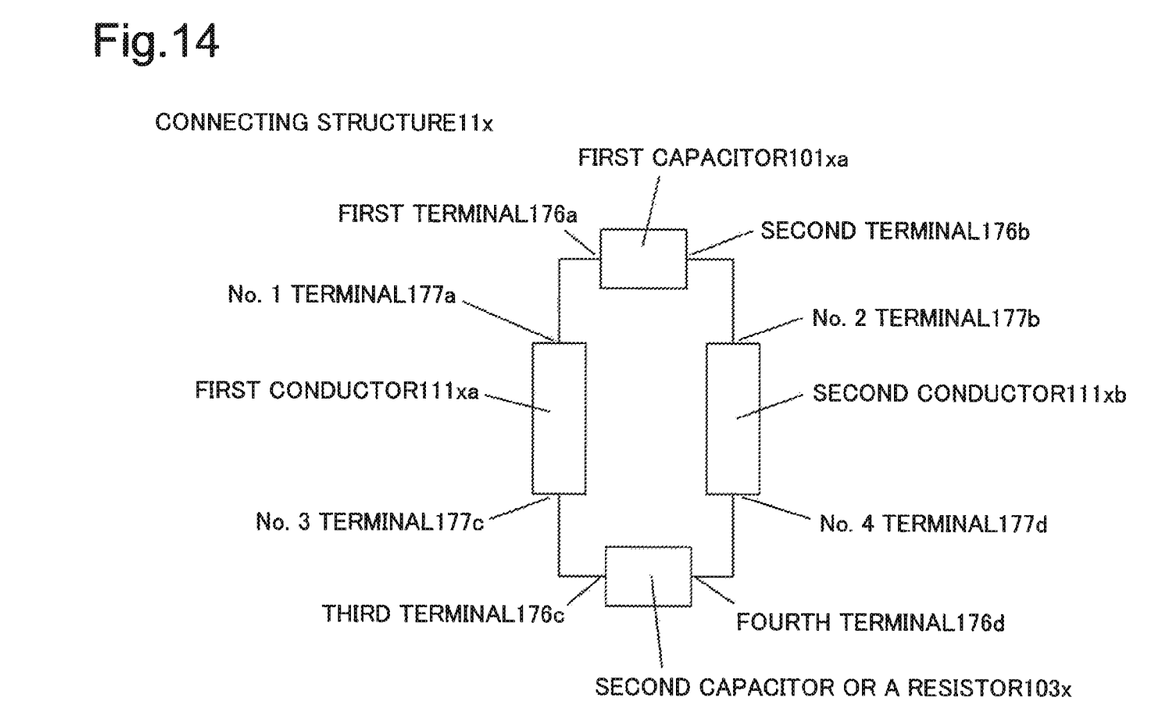
FIG. 14 is a block diagram illustrating a minimum structure of a connecting structure of the present invention.

FIG. 14 is a block diagram illustrating a connecting structure 11$x$ which is a minimum structure of the connecting structures of the present invention.

The connecting structure 11$x$ includes a first conductor 111$xa$, a second conductor 111$xb$, a first capacitor 101$xa$, and a second capacitor or a resistor 103$x$.

The first conductor 111$xa$ penetrates through a substrate which is not illustrated, and includes a first input/output section which is not illustrated.

The second conductor 111$xb$ penetrates through the substrate, and includes a second input/output section which is not illustrated.

A first terminal 176$a$ that is one terminal of the first capacitor 101$xa$ is coupled to a No. 1 terminal 177$a$ of the first conductor 111$xa$ which is a terminal on a first surface (not illustrated) of the substrate. A second terminal 176$b$ that is the other terminal of the first capacitor 101$xa$ is coupled to a No. 2 terminal 177$b$ that is a terminal of the second conductor 111$xb$ on the first surface.

A third terminal 176$c$ that is one of terminals of the second capacitor or resistor 103$x$ is coupled to a No. 3 terminal 177$c$ that is a terminal of the first conductor 111$xa$ on a second surface of the substrate. A fourth terminal 176$d$ that is a terminal which is not connected to the one terminal of the second capacitor or resistor 103$x$ is connected to a No. 4 terminal 177$d$ that is a terminal of the second conductor 111$xb$ on the second surface.

In the connecting structure 11$x$, the first input/output section is provided in a part of a side portion of the first conductor 111xa, and/or the second input/output section is provided in a part of a side portion of the second conductor 111xb.

The connecting structure 11x includes a stub formed in at least one of the first conductor 111xa and the second conductor 111xb.

Such stubs make the frequency characteristics of the output which occurs between an input signal and an output signal be aggravated as it has been described in the section of <Investigation into influence of a stub>. As is understood from each measurement result described in the first example embodiment and the second example embodiment, in order to suppress bad influence due to existence of such stub, it is effective to provide a capacitor or a resistance between the No. 3 terminal 177c and the No. 4 terminal 177d. That is, bad influence due to existence of a stub can be suppressed by installing the second capacitor or resistor 103x between the No. 3 terminal 177c and the No. 4 terminal 177d.

The connecting structure 11x exerts the above-mentioned effect without narrowing a wiring area of the substrate because removal of a stub by a back drill is not needed.

Therefore, by the aforementioned configuration, the connecting structure 11x exerts the effect described in the section of [Advantageous Effects of Invention].

Although each example embodiment of the present invention has been described above, the present invention is not limited to the above-mentioned example embodiments, and further transformation, substitution, and adjustment can be made within a range that does not deviate from the basic technical idea of the present invention. For example, configurations of elements indicated in each drawing are examples for helping understanding of the present invention, and the present invention is not limited to the configurations indicated in these drawings.

The whole or part of the example embodiments disclosed above can be described as, but not limited to, the following supplementary notes.

Supplementary Note 1

A connecting structure, including:
a first conductor that passes through a substrate and includes a first input/output section;
a second conductor that passes through the substrate and includes a second input/output section;
a first capacitor, one terminal of which being connected to a terminal of the first conductor that is on a first surface of the substrate, the other terminal of which being connected to a terminal of the second conductor that is on the first surface of the substrate; and
a second capacitor or a resistor, one terminal of which being connected to a terminal of the first conductor that is on a second surface of the substrate, another terminal of which that is not connected to the one terminal being connected to a terminal of the second conductor that is on the second surface, wherein
the first input/output section is provided to a portion of a side section of the first conductor, and/or the second input/output section is provided to a portion of a side section of the second conductor.

Supplementary Note 2

The connecting structure according to supplementary note 1, wherein the part of the side portion of the first conductor is a part of the side portion of the first conductor in a thickness wise direction of the substrate and/or the part of the side portion of the second conductor is a part of the side portion of the first conductor in a thickness wise direction of the substrate.

Supplementary Note 3

The connecting structure according to supplementary note 1 or supplementary note 2, wherein
at least one of the first conductor and the second conductor is a through-hole via provided to the substrate.

Supplementary Note 4

The connecting structure according to any one of supplementary notes 1 to 3, further including
a first wiring electrically connected to the first input/output section, and a second wiring electrically connected to the second input/output section.

Supplementary Note 5

The connecting structure according to supplementary note 4, wherein at least one of the first wiring and the second wiring is provided to the substrate.

Supplementary Note 6

The connecting structure according to supplementary note 4 or supplementary note 5, wherein
an input signal is assumed to be inputted to the first wiring, and an output signal is assumed to be outputted from the second wiring.

Supplementary Note 7

The connecting structure according to any one of supplementary notes 1 to 6, wherein
the second capacitor or resistor is the second capacitor.

Supplementary Note 8

The connecting structure according to supplementary note 7, wherein
a capacitance of the first capacitor and a capacitance of the second capacitor are approximately equivalent.

Supplementary Note 9

The connecting structure according to supplementary note 7 or supplementary note 8, wherein
the capacitance of the first capacitor is about 0.01 to about 1 µF.

Supplementary Note 10

The connecting structure according to any one of supplementary notes 1 to 6, wherein
the second capacitor or resistor is the resistance.

Supplementary Note 11

The connecting structure according to supplementary note 10, wherein
a capacitance of the first capacitor is approximately 0.1 µF, and a resistance value of the resistance is approximately 10Ω.

Supplementary Note 12

A circuit, including
a first differential amplifier; a second differential amplifier; and the connecting structure according to any one of supplementary notes 1 to 11 inserted between an output terminal of the first differential amplifier and a negative input terminal of the second differential amplifier.

Supplementary Note 13

The circuit according to supplementary note 12, wherein
a first one of the connecting structure is inserted between the output terminal of the first differential amplifier and a positive input terminal of the second differential amplifier, and a second one of the connecting structure is inserted between the output terminal of the first differential amplifier and the negative input terminal of the second differential amplifier.

Supplementary Note 14

The circuit according to supplementary note 13, wherein
the circuit is installed between an input buffer and an output buffer.

While the invention has been particularly shown and described with reference to example embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2016-183934 filed on Sep. 21, 2016, the disclosure of which is incorporated herein in its entirety by reference.

REFERENCE SIGNS LIST 11a, 11b, 11d and 11x Connecting structure
101a and 101b Capacitor
101xa First capacitor
102a Resistance
103x Second capacitor or resistor
111a and 111b Via
111xa First conductor
111xb Second conductor
121a Substrate
131a, 131b, 132a, 132b, 132c and 132d Wiring
133a, 133b, 133c and 133d Pad
141a and 141b Stub
176a First terminal
176b Second terminal
176c Third terminal
176d Fourth terminal
177a First terminal
177b Second terminal
177c Third terminal
177d Fourth terminal
178aa, 178ab, 178ac, 178ad, 178bb and 178bd Terminal
181a, 181b, 181c, 181d, 182a and 182b End
186a and 186b Side portion
191a and 191b Length
231b Hole
291a, 291b and 291c Line

What is claimed is:

1. A connecting structure, including:
a first conductor that passes through a substrate and includes a first input/output section;
a second conductor that passes through the substrate and includes a second input/output section;
a first capacitor, one terminal of which being connected to a terminal of the first conductor that is on a first surface of the substrate, the other terminal of which being connected to a terminal of the second conductor that is on the first surface of the substrate; and
a second capacitor or a resistor, one terminal of which being connected to a terminal of the first conductor that is on a second surface of the substrate, another terminal of which that is not connected to the one terminal being connected to a terminal of the second conductor that is on the second surface, wherein
the first input/output section is provided to a portion of a side section of the first conductor, and/or the second input/output section is provided to a portion of a side section of the second conductor.

2. The connecting structure according to claim 1, wherein the part of the side portion of the first conductor is a part of the side portion of the first conductor in a thickness wise direction of the substrate and/or the part of the side portion of the second conductor is a part of the side portion of the first conductor in a thickness wise direction of the substrate.

3. The connecting structure according to claim 1, wherein at least one of the first conductor and the second conductor is a through-hole via provided to the substrate.

4. The connecting structure according to claim 1, further including
a first wiring electrically connected to the first input/output section, and a second wiring electrically connected to the second input/output section.

5. The connecting structure according to claim 4, wherein at least one of the first wiring and the second wiring is provided to the substrate.

6. The connecting structure according to claim 4, wherein an input signal is assumed to be inputted to the first wiring, and an output signal is assumed to be outputted from the second wiring.

7. The connecting structure according to claim 1, wherein the second capacitor or resistor is the second capacitor.

8. The connecting structure according to claim 7, wherein a capacitance of the first capacitor and a capacitance of the second capacitor are approximately equivalent.

9. The connecting structure according to claim 7, wherein the capacitance of the first capacitor is about 0.01 to about 1 pF.

10. The connecting structure according to claim 1, wherein
the second capacitor or resistor is the resistance.

11. The connecting structure according to claim 10, wherein
a capacitance of the first capacitor is approximately 0.1 pF, and a resistance value of the resistance is approximately 10 Ω.

12. A circuit, including
a first differential amplifier; a second differential amplifier; and the connecting structure according to claim 1 inserted between an output terminal of the first differential amplifier and a negative input terminal of the second differential amplifier.

13. The circuit according to claim 12, wherein
a first one of the connecting structure is inserted between the output terminal of the first differential amplifier and a positive input terminal of the second differential amplifier, and a second one of the connecting structure is inserted between the output terminal of the first differential amplifier and the negative input terminal of the second differential amplifier.

14. The circuit according to claim 13, wherein the circuit is installed between an input buffer and an output buffer.

* * * * *